United States Patent
Smith et al.

(10) Patent No.: US 8,429,313 B2
(45) Date of Patent: Apr. 23, 2013

(54) CONFIGURABLE READY/BUSY CONTROL

(75) Inventors: Peter Smith, Midlothian (GB); Sergey Gorobets, Edinburgh (GB)

(73) Assignee: SanDisk Technologies Inc., Plano, TX (US)

( * ) Notice: Subject to any disclaimer, the term of this patent is extended or adjusted under 35 U.S.C. 154(b) by 2164 days.

(21) Appl. No.: 10/857,532

(22) Filed: May 27, 2004

(65) Prior Publication Data

US 2005/0268025 A1    Dec. 1, 2005

(51) Int. Cl.
G06F 3/00   (2006.01)
G06F 12/00  (2006.01)

(52) U.S. Cl.
USPC .............. 710/18; 710/17; 710/19; 711/144; 711/156

(58) Field of Classification Search .............. 710/18
See application file for complete search history.

(56) References Cited

U.S. PATENT DOCUMENTS

| 5,070,032 | A |   | 12/1991 | Yuan et al. |
| 5,095,344 | A |   | 3/1992  | Harari |
| 5,313,421 | A |   | 5/1994  | Guterman et al. |
| 5,315,541 | A |   | 5/1994  | Harari et al. |
| 5,343,063 | A |   | 8/1994  | Yuan et al. |
| 5,388,248 | A |   | 2/1995  | Robinson |
| 5,428,566 | A |   | 6/1995  | Robinson |
| 5,428,579 | A |   | 6/1995  | Robinson et al. |
| 5,513,138 | A |   | 4/1996  | Manabe et al. |
| 5,570,315 | A |   | 10/1996 | Tanaka et al. |
| 5,574,850 | A |   | 11/1996 | Fandrich et al. |
| 5,623,686 | A |   | 4/1997  | Hall et al. |
| 5,661,053 | A |   | 8/1997  | Yuan |
| 5,774,397 | A |   | 6/1998  | Endoh et al. |
| 5,798,968 | A |   | 8/1998  | Lee et al. |
| 5,822,251 | A | * | 10/1998 | Bruce et al. .............. 365/185.33 |
| 5,890,192 | A |   | 3/1999  | Lee et al. |
| 6,046,935 | A |   | 4/2000  | Takeuchi et al. |
| 6,222,762 | B1|   | 4/2001  | Guterman et al. |
| 6,337,810 | B1| * | 1/2002  | Yamasaki et al. ........ 365/189.05 |

(Continued)

FOREIGN PATENT DOCUMENTS

EP   0 707 267 A   4/1996
EP   0 874 368 A   10/1998

(Continued)

OTHER PUBLICATIONS

EPO/ISA, "Notification of Transmittal of the International Search Report and the Written Opinion of the International Searching Authority, or the Declaration," mailed in corresponding International Application No. PCT/US2005/01770 on Jan. 18, 2006, 14 pages.

(Continued)

*Primary Examiner* — Henry Tsai
*Assistant Examiner* — Dean Phan
(74) *Attorney, Agent, or Firm* — Weaver Austin Villeneuve & Sampson, LLP

(57) ABSTRACT

A memory unit has a busy control system that includes a busy control register that may be written by a controller. The contents of the busy control register determine whether a signal is sent from the memory unit to the controller and, if so, which of a plurality of signals is sent. A signal may automatically be sent from a selected memory unit and masked from an unselected unit.

17 Claims, 9 Drawing Sheets

U.S. PATENT DOCUMENTS

| | | |
|---|---|---|
| 6,349,056 B1 | 2/2002 | Conley et al. |
| 6,522,580 B2 | 2/2003 | Chen et al. |
| 6,549,469 B2 | 4/2003 | Gochi |
| 6,560,143 B2 | 5/2003 | Conley et al. |
| 6,763,424 B2 | 7/2004 | Conley |
| 6,834,322 B2 | 12/2004 | Sukegawa |
| 7,023,741 B2 * | 4/2006 | Nakamura et al. ....... 365/189.04 |
| 2001/0018724 A1 | 8/2001 | Sukegawa |
| 2002/0069374 A1 * | 6/2002 | Kopser et al. ................. 713/400 |
| 2002/0141238 A1 | 10/2002 | Pasternak |
| 2002/0191442 A1 * | 12/2002 | Kobayashi et al. ...... 365/185.11 |
| 2003/0021163 A1 * | 1/2003 | Nakazawa et al. ....... 365/189.12 |
| 2003/0103392 A1 | 6/2003 | Matsushita et al. |
| 2004/0057297 A1 | 3/2004 | Jang et al. |

FOREIGN PATENT DOCUMENTS

| | | |
|---|---|---|
| EP | 1 304 619 A | 4/2003 |
| WO | WO 02/058074 | 7/2002 |
| WO | WO2005/119693 | 12/2005 |

OTHER PUBLICATIONS

ISA/EPO, "Invitation to Pay Additional Fees with Communication Relating to the Results of the Partial International Search" mailed Nov. 3, 2005 in corresponding PCT Appln. No. PCT/US2005/017770, 5 pages.

European Patent Office, Office Action mailed in corresponding European Application No. 05 752 293.0 on Jul. 5, 2007, 4 pages.

Republic of China, Patent Certificate in corresponding Taiwanese Application No. 094117522, issued as I280580 on May 1, 2007, 2 pages (including translation).

Chinese Office Action dated Jan. 9, 2009 issued in CN 2005800226736.

Korean Office Action dated May 31, 2011 issued in KR 2006-7024902.

* cited by examiner

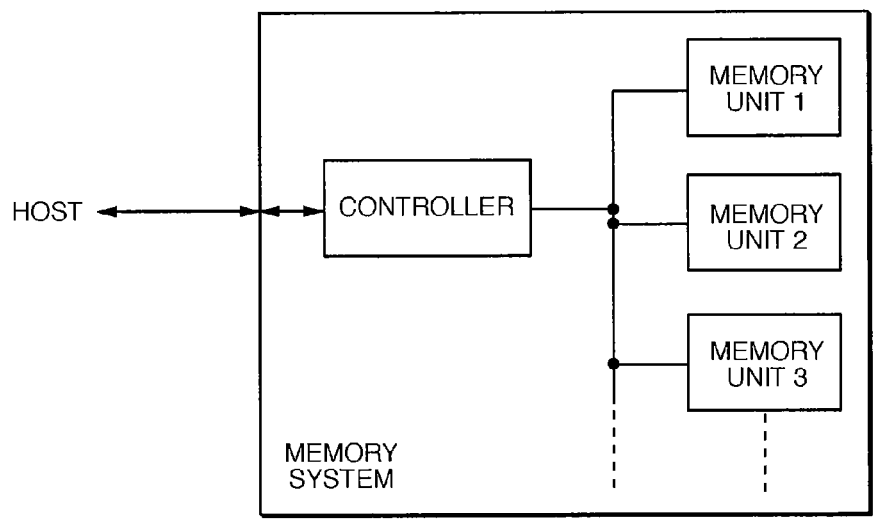
FIG._1 (PRIOR ART)
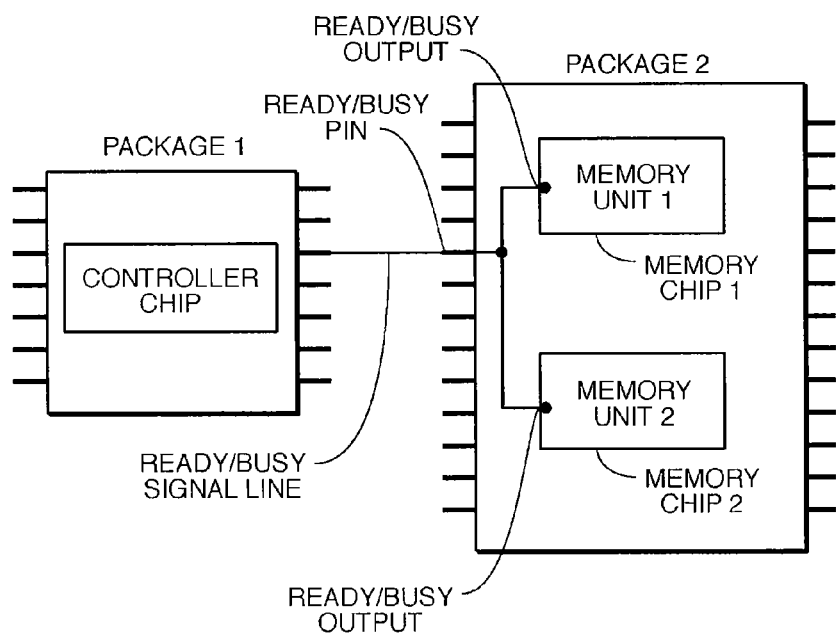
FIG._2 (PRIOR ART)

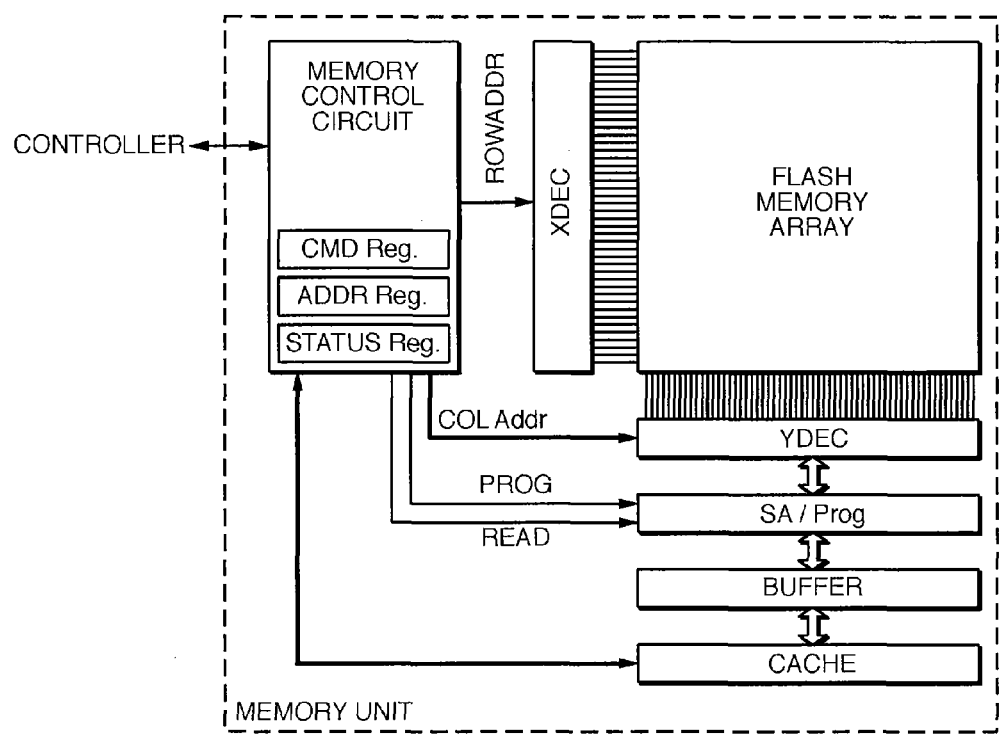
*FIG._3 (PRIOR ART)*

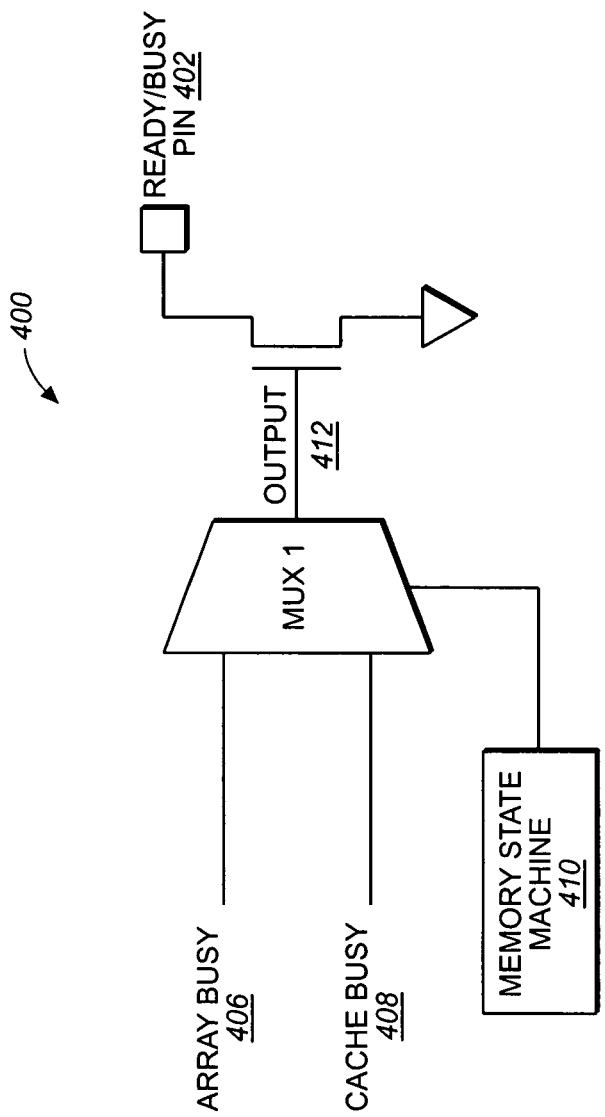
FIG._4

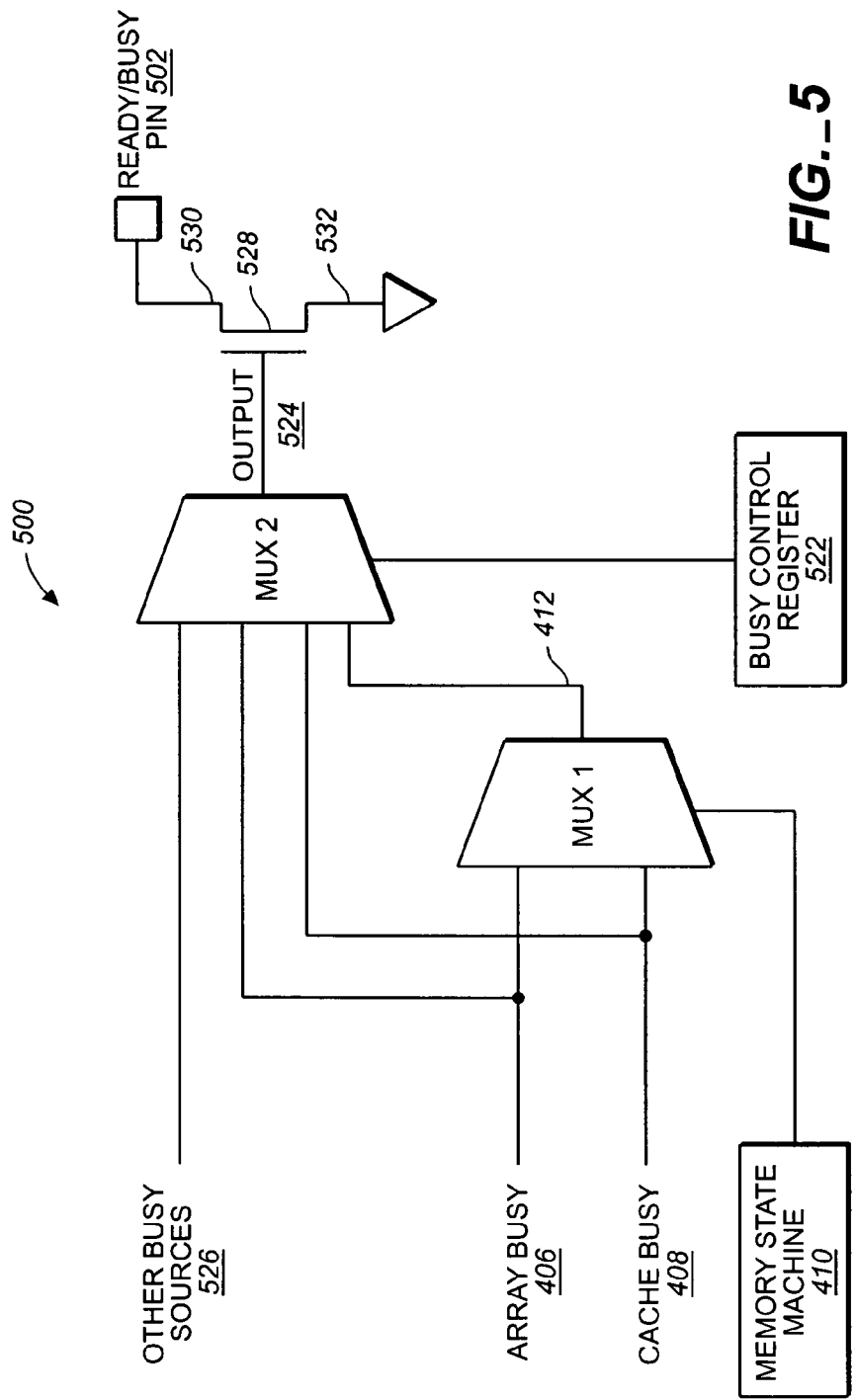

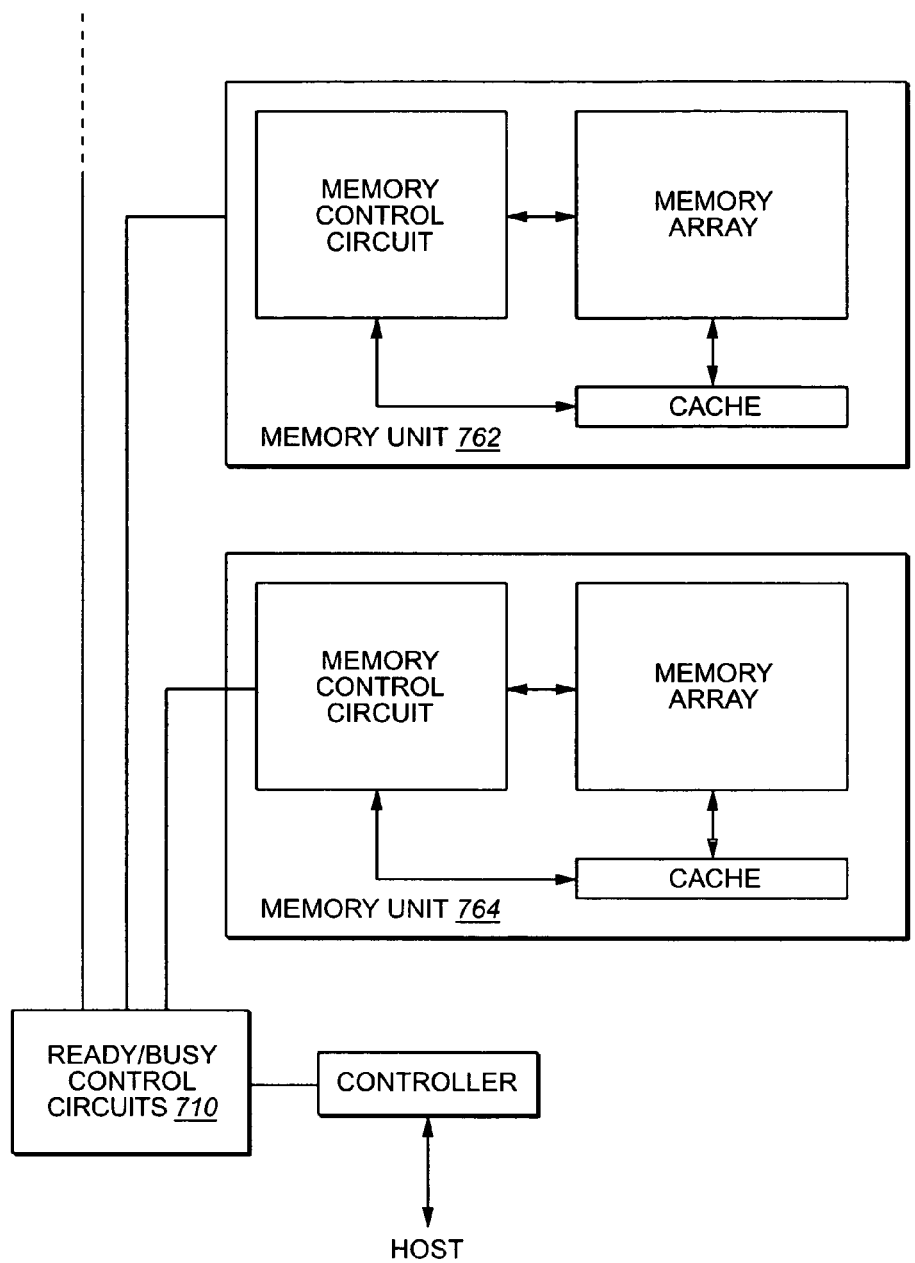
FIG._7

| 7 | 6 | 5 | 4 | 3 | 2 | 1 | 0 |
|---|---|---|---|---|---|---|---|
| AUTO | DISABLE | X | X | X | X | SELECT | |

FIG._8  ← 522

| | DieSelected | AUTO | DISABLE | SELECT | OUTPUT 524 |
|---|---|---|---|---|---|
| LINE 1 | X | X | 1 | XX | 0 |
| LINE 2 | X | 0 | 0 | 00 | Internal Busy 412 |
| LINE 3 | X | 0 | 0 | 01 | Cache Busy 408 |
| LINE 4 | X | 0 | 0 | 10 | Array Busy 406 |
| LINE 5 | X | 0 | 0 | 11 | Other Busy 526 |
| LINE 6 | 0 | 1 | 0 | XX | 0 |
| LINE 7 | 1 | 1 | 0 | 00 | Internal Busy 412 |
| LINE 8 | 1 | 1 | 0 | 01 | Cache Busy 408 |
| LINE 9 | 1 | 1 | 0 | 10 | Array Busy 406 |
| LINE 10 | 1 | 1 | 0 | 11 | Other Busy 526 |

FIG._9

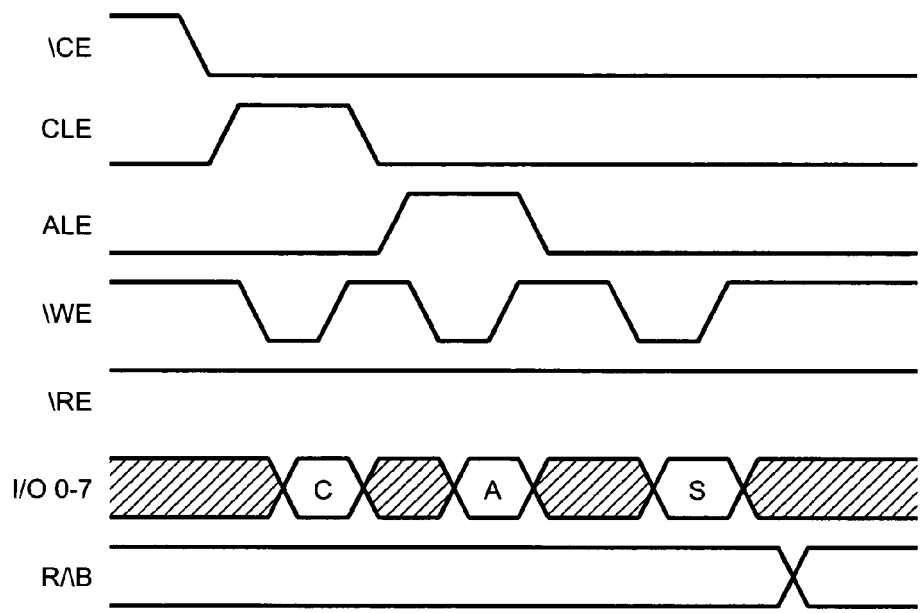
FIG._10
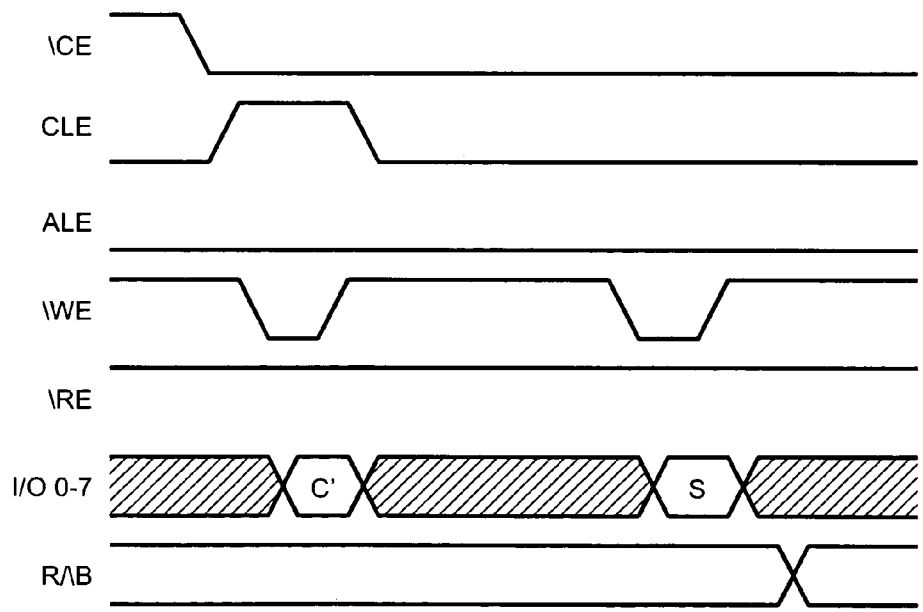
FIG._11

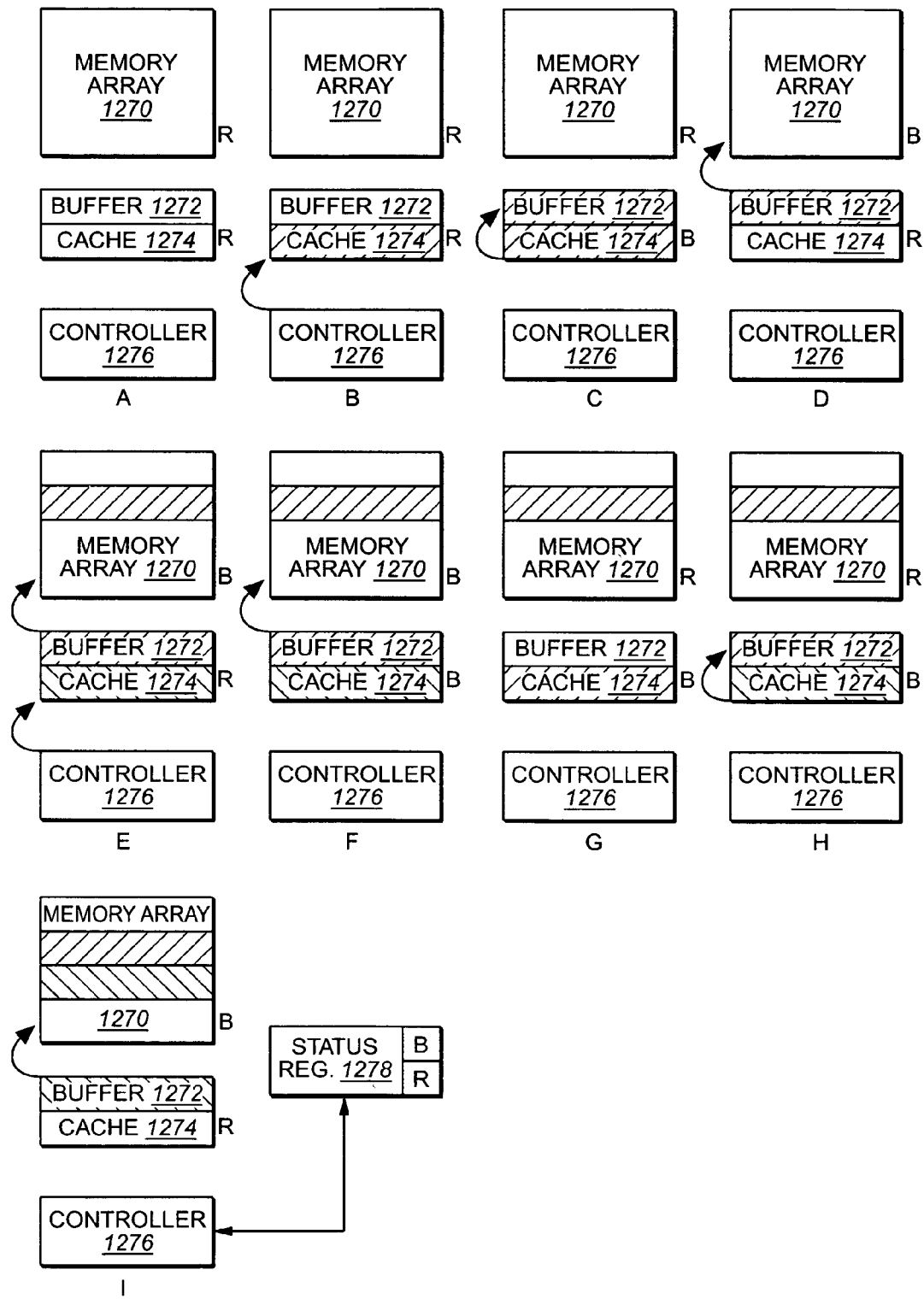
FIG._12

CONFIGURABLE READY/BUSY CONTROL

BACKGROUND OF THE INVENTION

This application relates to integrated circuits and particularly to integrated circuits such as non-volatile memories that are in communication with a controller via one or more signal lines.

Integrated circuits including various memory devices may be connected together via conductive lines or traces. Integrated circuits may be connected together within a package in some examples. Examples of such connections may be found in non-volatile memory products. There are many commercially successful non-volatile memory products being used today, particularly in the form of small form factor cards, which employ an array of flash EEPROM (Electrically Erasable and Programmable Read Only Memory) cells formed on one or more integrated circuit chips. A memory controller, usually but not necessarily on a separate integrated circuit chip, interfaces with a host to which the card is removably connected and controls operation of the memory array within the card. Such a controller typically includes a microprocessor, some non-volatile read-only-memory (ROM), a volatile random-access-memory (RAM) and one or more special circuits such as one that calculates an error-correction-code (ECC) from data as they pass through the controller during the programming and reading of data. Some of the commercially available cards are CompactFlash™ (CF) cards, MultiMedia cards (MMC), Secure Digital (SD) cards, Smart Media cards, personnel tags (P-Tag) and Memory Stick cards. Hosts include personal computers, notebook computers, personal digital assistants (PDAs), various data communication devices, digital cameras, cellular telephones, portable audio players, automobile sound systems, and similar types of equipment. Besides the memory card implementation, this type of memory can alternatively be embedded into various types of host systems.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in U.S. Pat. Nos. 5,070,032, 5,095,344, 5,313,421, 5,315,541, 5,343,063, 5,661,053 and 6,222,762. These patents, and all patents and published patent applications referenced in this application, are incorporated by reference in their entirety.

The NAND array utilizes series strings of more than two memory cells, such as 16 or 32, connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315, 5,774,397, 6,046,935, and 6,522,580.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. A triple layer dielectric formed of silicon oxide, silicon nitride and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region, and erased by injecting hot holes into the nitride.

As in many integrated circuit applications, the pressure to shrink the silicon substrate area required to implement some integrated circuit function also exists with flash EEPROM memory cell arrays. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell and/or per storage unit or element. This is accomplished by dividing a window of a storage element charge level voltage range into more than two states. The use of four such states allows each cell to store two bits of data, eight states stores three bits of data per storage element, and so on. Memory arrays that use such multi-level logic are particularly vulnerable to corruption of data from small changes in stored charge. Selected portions of a multi-state memory cell array may also be operated in two states (binary) for various reasons.

Memory cells of a typical flash EEPROM array are divided into discrete blocks of cells that are erased together. That is, the block is the erase unit, a minimum number of cells that are simultaneously erasable. Each block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the block in which they are stored. Such memories are typically configured with 16, 32 or more pages within each block, and each page stores one or just a few host sectors of data.

In order to increase the degree of parallelism during programming user data into the memory array and reading user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

To further efficiently manage the memory, blocks may be linked together to form virtual blocks or metablocks. That is, each metablock is defined to include one block from each plane. Use of the metablock is described in international patent application publication no. WO 02/058074. The metablock is identified by a host logical block address as a destination for programming and reading data. All blocks of a metablock may be programmed at the same time. The unit of programming of such a metablock is a metapage, which consists of one page from each block of the metablock. Similarly, all blocks of a metablock are erased together. In some examples, metablock size is fixed so that the metablock is the minimum unit of erase and the metapage is the minimum unit of programming. The controller in a memory system operated with such large blocks and/or metablocks performs a number of functions including the translation between logical block addresses (LBAs) received from a host, and physical block numbers (PBNs) within the memory cell array. Individual pages within the blocks are typically identified by offsets within the block address. Address translation often involves use of intermediate terms of a logical block number (LBN) and logical page.

One or more registers may be used to move data into and out of a memory cell array. Examples of a multiple register memory systems are described in U.S. Pat. Nos. 6,349,056 B1 and 6,560,143 B2. A register typically holds data equal to the data in one row of the memory cell array. A register is generally volatile and therefore any data in such a register is lost if there is a loss of power. A register may be used as a buffer or cache to hold data that is to be programmed to the memory array, or data that is to be sent to a host.

A memory system generally has a controller. A controller may include a microprocessor or micro-controller that is connected through controller interface logic to internal memories and interfaces with external components. A program memory stores the firmware and software accessed by the microcontroller to control the memory system operation to read data from the connected memory units and transmit that data to the host, to write data from the host to the memory chip(s), and to carry out numerous other monitoring and controlling functions.

Integrated circuits are typically formed on a semiconductor substrate by a series of processing steps. The substrates are then divided into individual integrated circuit chips ("die" or "chips"), which may be individually packaged. Alternatively, chips may be packaged so that more than one chip is in a package. For example, two or more memory chips may be packaged together to provide increased memory capacity within a single package. This may provide a cheaper alternative to using separate packages or forming a larger memory on a single chip. Packaging may be by conventional chip packaging methods where chips are encapsulated within a protective shell and pads on the chips are electrically connected to pins on the package to allow communication with the chips. Memory chips packaged in this way may be used in various applications including non-volatile memory systems. Such systems typically include a controller, which may be formed on a separate chip and may be separately packaged.

FIG. 1 shows an example of a memory system including a controller and multiple memory units. The controller is in communication with a host. The memory system of FIG. 1 may be in a memory card such as the commercially available flash memory products previously described. In some examples, each memory unit is separately packaged and the packages are connected to the controller. In other examples, the controller and memory units may be packaged together in a single package. In other examples, two or more memory units may be packaged together and the package thus formed is connected to the controller, which is in a separate package. In flash memory cards, individual packages may be mounted to a printed circuit board, which provides connecting lines between the pins of different packages. It is generally desirable to reduce the number of such lines because they add to the cost and complexity of the memory system. Therefore, when multiple chips are packaged together, they may share a single pin on the package and thus share a single line for communication with the controller.

FIG. 2 shows an example of a memory system having a controller chip in one package (package 1) in communication with two memory chips (memory unit 1 and memory unit 2) in a second package (package 2). Here, each memory unit is formed on an individual memory chip. Thus, memory unit 1 is formed on memory chip 1 and memory unit 2 is formed on memory chip 2. Both memory units 1 and 2 have ready/busy outputs that are connected to a common ready/busy pin on package 2. This common pin connects to the controller chip via a common ready/busy signal line. Though not shown, many other connections may exist between package 1 and package 2. The ready/busy pin is shared to reduce the pin count of both packages and thus reduce the cost and complexity of the system. One problem of such a system is that the ready/busy signal received by the controller may only indicate that one of the memory units is busy, but not which one. Thus, when a busy signal is received, it is not known which memory unit is busy or if one memory unit is ready.

Typically, a high voltage on the signal line may indicate that the integrated circuit is ready, while a low voltage indicates that it is busy. In certain examples, it may be desirable to know more information than just the condition of the integrated circuit as a whole. For example, in memory units having a cache connected to a memory array, it may be useful to know both the condition of the memory array and the condition of the cache. With a single ready/busy signal, this information may not be available to the controller.

FIG. 3 shows an example of a memory unit having a memory array and two registers, a cache (master data register) and a buffer (slave data register). The memory array and connected registers may be considered to be a buffered memory array because both registers serve a buffering function. In addition, this memory unit has a memory control circuit that is in communication with a controller. Communication with the controller takes place over a group of lines that may include a chip enable (CE) line, command latch enable (CLE) line, address latch enable (ALE) line, write enable (WE) line, read enable (RE) line, a set of input/output (I/O) lines and a ready/busy (RIB) line. This memory unit may be packaged individually or with other memory units. In general, a memory unit such as the one shown in FIG. 3 is formed on a dedicated memory chip so that one chip has one memory unit including a memory array and a memory control circuit. Host data from the controller may be sent by the memory control circuit to the cache, then to the buffer and then to the flash memory array. This allows host data to be loaded into the cache at the same time that other data are programmed from the buffer to the flash memory array. This parallelism may speed up data transfer to the flash memory array. However, a ready/busy signal from such a system may only provide one bit of data. The signal may represent that the array is in a first condition such as array busy, or a second condition such as array ready. However, it may be useful to know additional information such as whether the cache is busy or not.

Therefore, there is a need for a control system that allows more information to be provided to the controller along a single line. There is also a need for a system to be configurable by the controller. There is also a need for a system that would allow a controller to determine a condition of an individual integrated circuit that shares a ready/busy line with other integrated circuits.

SUMMARY

A memory control system is disclosed that allows additional functionality to be achieved using a single line that connects two components such as a controller and a memory chip. Where a ready/busy line is used to represent some condition of a memory chip to the controller, a memory control system may allow additional information to be represented using the same line. The controller may write the contents of a register in the memory chip to configure the signal sent by the memory chip. In this way, the controller can choose the ready busy signal from a range of possible signals by configuring the register. The selected signal is then provided by the memory chip to the controller without the need for additional activity by the controller. The controller does not have to actively interrogate the memory chip to determine a condition in the memory chip. Instead, the controller may passively receive a signal indicating the condition of interest. In some designs, a controller may passively receive such signals in a low power or "sleep" mode that saves energy. The controller may then return to a powered condition when the signal changes. For example, a controller may sleep while a memory unit is busy and wake when the memory unit is ready for the next command. In a memory unit having a memory array and a cache, a condition of the memory array and a condition of the cache may be indicated by separate signals. The controller may choose which of these signals to send on a ready/busy line to the controller by configuring the contents of a busy control register.

A controller may also configure the register so that the busy signal from a particular memory chip is masked and does not affect the signal on a ready/busy line. This is useful where multiple chips share the same ready/busy line. Individual chips may be masked so that the controller receives a signal from only an unmasked chip or chips. In this way, a controller may explicitly identify which chips are to have their signals masked and which have their signals sent to the controller.

As an alternative to having a controller individually determine which chips should have their signal masked and which should have their signal sent, in an autoselect mode, this determination may be made at the chip level. The signal is sent if the chip is selected and is masked if the chip is not selected. Selection of a chip in this context means that a particular line enabling the chip is active, or that the chip is addressed by a controller command, or some combination of an active enabling line and a command. A selected chip is generally the chip addressed by the last command received. In this system, only a selected chip sends a busy signal. As one chip is deselected and another is selected, the deselected chip signal becomes masked and the selected chip signal is sent to the controller automatically without the need for the controller to make a separate configuration change. This allows the controller to receive a ready/busy signal that is specific to one chip over a line that is shared by several chips. The signal may automatically come from a different chip as different chips are selected without the need for a separate command from the controller to specify which signals are to be sent and which are to be masked.

BRIEF DESCRIPTION OF THE DRAWINGS

FIG. 1 shows a memory system of the prior art.

FIG. 2 shows a controller chip in communication with two memory units that share a single ready/busy pin of the prior art.

FIG. 3 shows a memory unit of the prior art.

FIG. 4 shows a control system that selects an output based on the current state of a memory state machine.

FIG. 5 shows a control system according to an embodiment of the present invention.

FIG. 7 shows another example of a memory system having ready/busy control circuits.

FIG. 8 shows a more detailed view of the busy control register of FIG. 5 including the contents of the register.

FIG. 9 shows a truth table for the contents of the busy control register of FIG. 8.

FIG. 10 shows a timing diagram for a command that writes the contents of the busy control register of FIG. 8.

FIG. 11 shows a timing diagram for an alternative command that writes the contents of one or more busy control registers such as those shown in FIG. 8.

FIG. 12A shows an example of a memory system having a memory array, a buffer, a cache and a controller.

FIG. 12B shows the memory system of FIG. 12A where data is transferred from the controller to the cache.

FIG. 12C shows the memory system of FIG. 12B where the data is transferred from the cache to the buffer.

FIG. 12D shows the memory system of FIG. 12C where the data is transferred from the buffer to the memory array.

FIG. 12E shows the memory system of FIG. 12D where data is transferred from the controller to the cache in parallel with the transfer of data from the buffer to the memory array.

FIG. 12F shows the memory system of FIG. 12E after completion of the transfer of data from the controller to the cache, but prior to completion of the transfer of data from the buffer to the array of FIG. 12E.

FIG. 12G shows the memory system of FIG. 12F after completion of the transfer of data from the buffer to the array.

FIG. 12H shows the memory system of FIG. 12G while data is transferred from the cache to the buffer.

FIG. 12I shows the memory system of FIG. 12H where data is transferred from the buffer to the memory array and no further data is sent by the controller to the cache and where the controller polls a status register to determine whether the memory array is busy.

DETAILED DESCRIPTION

Figure 6:
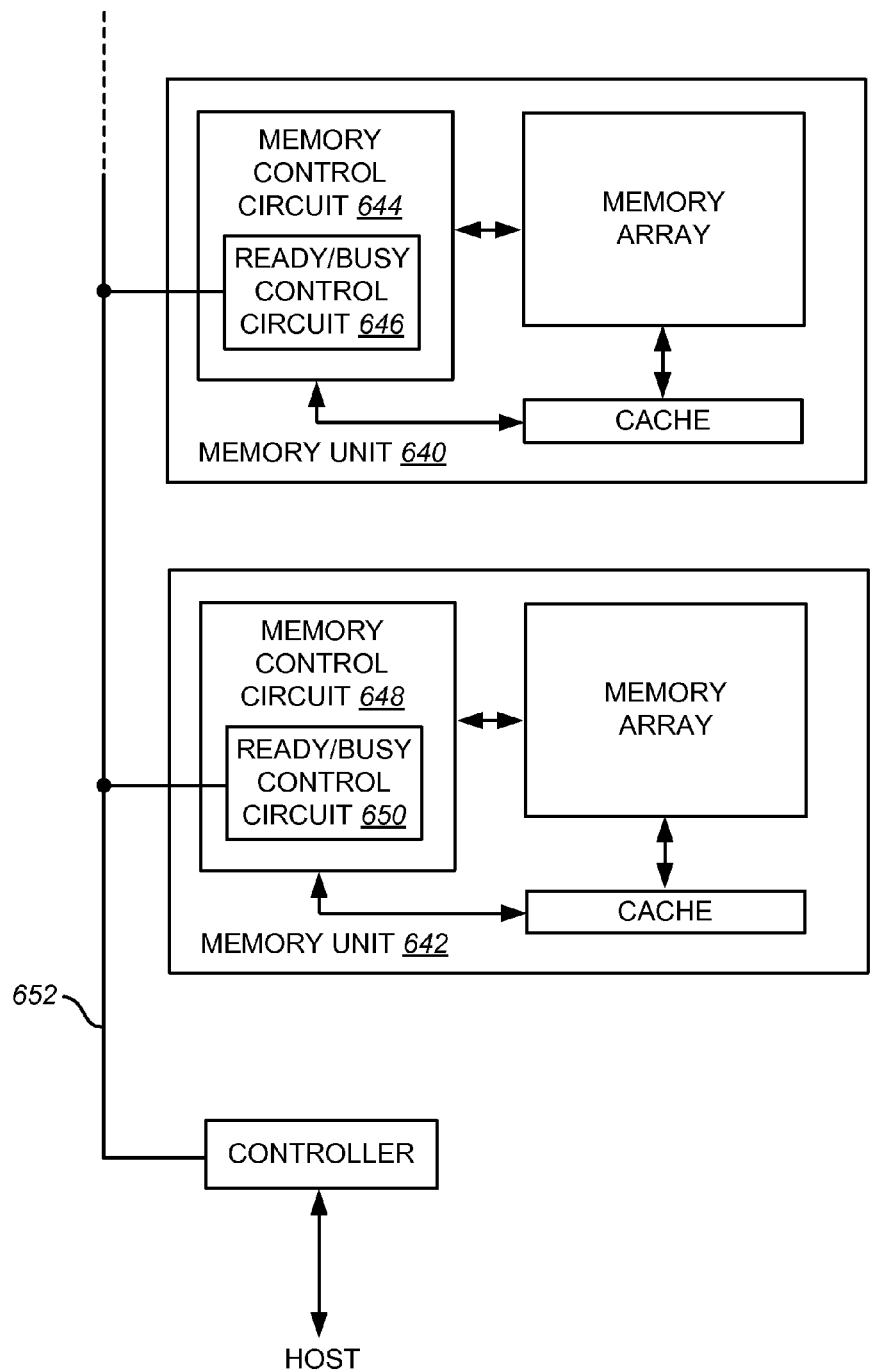
FIG. 6 shows a memory system with memory units having control circuits shown in FIG. 5.

FIG. 4 shows a circuit diagram for an equivalent circuit 400 for a signal control system used to control a ready/busy pin 402. Two signals are shown being received by a multiplexer, MUX 1, an array busy signal 406 and a cache busy signal 408. A memory state machine 410 determines which of the signals 406, 408 is applied to the output 412 that controls the ready/busy pin 402 of the memory and thus determines which signal is received by the controller. Only one of the signals, array busy 406 and cache busy 408, is applied to the output 412 at a time. The state machine 410 may operate so that the output 412 depends on the last command received by the memory or some other factor. The output 412 is determined by the current state of the memory state machine 410 and is therefore not directly configurable by the controller without changing the state of the memory.

FIG. 5 shows a circuit diagram for an equivalent circuit 500 for a signal control system according to one embodiment of the present invention that allows additional data to be sent via a ready/busy line so that the ready/busy signal may represent more than just two conditions in a memory unit. This control system may be implemented as the control circuit shown or in some equivalent manner. A first multiplexer, MUX 1, is provided that has inputs array busy 406 and cache busy 408 indicating conditions of the array and cache respectively. The output of MUX 1 is selected according to the state of the memory state machine 410 in the manner previously described. Thus, the output of MUX 1 is equivalent to the output 412 previously described. However, unlike the previous circuit, FIG. 5 shows the output of MUX 1 going to a second multiplexer, MUX 2, which is controlled by a busy control register 522. The output 524 of MUX 2 becomes the busy output of the control system. Thus, MUX 2 is interposed between the previously described output 412 and the output provided by this system. This allows the output 524 to be configured through modification of the contents of the busy control register 522. The contents of the busy control register 522 may be directly modified by the controller.

The busy output 524 may be chosen from the inputs to MUX 2. Inputs to MUX 2 include the output 412 of MUX 1, array busy 406, cache busy 408 and other busy sources 526. FIG. 5 shows a single line representing other busy sources 526. However, other busy sources 526 may include multiple inputs to MUX2 that represent multiple conditions within a memory unit. Thus the meaning of output 524 may be configured according to the information desired.

One possible output of MUX 2 is simply the output of MUX 1. In this case, the control circuit behaves as if MUX 2 was not present. Thus, the control system may be configured to behave as the previously described control system of FIG. 4 so that backward compatibility may be maintained.

Either array busy 406 or cache busy 408 may be selected as an output of MUX 2. While these are also possible outputs of MUX 1, the output of MUX 1 is not configurable according to the contents of a register that the controller may modify. The signal generated by MUX 1 is produced in a deterministic way based on the current state of the memory state machine 410, while the signal generated by MUX 2 is produced in a configurable way that the controller may modify. In the present system, an output may be directly selected by the controller. The selection may be changed while a memory unit is in operation executing a command.

The output of MUX 2 goes to the gate of a transistor 528 that has its drain 530 connected to a ready/busy pin 502 and its source connected to ground. In operation, the ready/busy pin 502 may be connected to a signal line that connects to the controller. When the output of MUX 2 is "high," indicating a busy condition, the transistor 528 is turned on and the ready/busy pin 502 voltage is brought to ground or "low." When the output of MUX 2 is "low," indicating a ready condition, the transistor 528 is turned off and the ready/busy pin 502 voltage rises to a "high" level, the voltage of a supply that is connected to the signal line. Thus, the transistor 528 works as an inverter of output 524 from MUX 2.

While the above description refers to a specific example using multiplexers in a control circuit, the techniques described are not limited to any particular hardware configuration. The above example demonstrates techniques that may be performed using different hardware, or may be achieved using software. The control circuit shown may be considered an equivalent circuit for various control systems that may be used. A control system may be implemented in different ways using different control circuits or using software.

In some examples, more than one control system is connected to a common signal line. Thus, the ready/busy pin of FIG. 5 may be connected to other ready/busy pins of other control systems by a shared signal line. Such a line may be made of one or more contiguous portions of electrically conductive material. For example, a metal trace formed on a printed circuit board may form a signal line or part of a signal line. However, such a shared line may hide the conditions of particular integrated circuits. When even one integrated circuit is busy, its control system produces a high output that causes the corresponding ready/busy pin to be brought to a "low" state. This in turn brings the connected signal line low. The conditions of all other integrated circuits whose control systems are connected to the signal line are then hidden from the controller. This means that any change in the output of these control systems is not detected by the controller. If another control circuit output transitions from ready to busy, this may not be detected by the controller because it already receives a busy signal. Thus, the busy signal received by the host indicates only that an integrated circuit is busy, but not which one.

In one embodiment of the present invention, the busy control register may be used to mask the output of a control system as required by a controller. Thus, output 524 may be held low in response to one or more bits in the busy control register 522, regardless of what conditions are indicated by the inputs 406, 408 to the control system. This disable feature may allow the controller to identify one or more integrated circuits that are to be monitored and to ignore other integrated circuits.

In another embodiment of the present invention, an autoselect feature may be enabled by the busy control register. This feature allows a control system to mask its output selectively depending on whether the integrated circuit connected to the control system is selected or not. The autoselect feature disables the output 524 of MUX 2 unless the corresponding integrated circuit is selected. This occurs automatically at the level of the control system in autoselect mode without direct controller intervention. Thus, once autoselect is enabled by the controller, the control system may send or mask its signal as appropriate without further input from the controller to the control system. Selection may be determined by the state of the chip enable CE line or by the last addressed integrated circuit or some combination of these two factors. An additional bit in busy control register 522 may be used to select which criteria determine selection for autoselect purposes. For example, selection based on the CE signal, selection based on last addressed command and selection based on both of these criteria provide three different autoselect possibilities. There is also the possibility of disabling autoselect, providing a total of four possibilities. These four possibilities may be selected using two bits in busy control register 522, for example bits 5 and 7.

An example of a memory system that has memory units using the control system described is shown in FIG. 6. Two memory units 640, 642 are shown. Memory unit 640 has memory control circuit 644 that includes ready/busy control circuit 646. Memory unit 642 has memory control circuit 648 that includes ready/busy pin 650. Both ready/busy control circuits 646, 650 are connected to a common signal line. The common signal line may extend to other memory units also. Where autoselect is enabled in a ready/busy circuit, the ready/busy signal from that circuit will be masked (held in the ready state) unless the memory unit containing that ready/busy circuit is selected. Generally, autoselect is enabled or disabled for all memory units connected to a controller together. In this way, only a memory unit selected by the controller will have its ready/busy signal sent to the controller. Any memory units that are not enabled have their ready/busy signal masked by the ready/busy control circuit. In this configuration, the ready/busy signal indicates not only that a memory unit is busy; it also indicates which specific memory unit is busy because generally, only one memory unit is selected at a time. If more than one memory unit is selected and autoselect is enabled, the busy signal could come from any of the selected memory units. For example, where autoselect is enabled for the memory units of FIG. 6 (memory units 640, 642 and any additional memory units connected to signal line), if memory unit 640 is selected, only the ready/busy signal from memory unit 640 is received by the controller. In this situation, the memory array or cache of memory unit 642 may still be busy from some recent command. However, memory unit 642 is not selected and memory 640 is selected. A busy condition may exist in memory unit 642, but a signal showing this condition is not sent to the controller. Instead, the signal is masked by the ready/busy control circuit 650 of memory unit 642. Similarly, any busy signal from other memory units connected to the signal line 652 is masked by its ready/busy control circuit if the memory unit is not selected.

FIG. 7 shows an alternative embodiment where a number of memory units are connected to ready/busy control circuits 760 that are separate from any individual memory unit. Each memory unit 762, 764 has a ready/busy output or outputs (only one line is shown, but individual lines may be provided for array busy, cache busy and other busy signals). The ready/busy control circuits 760 operate in the same manner as described above but are located on a separate die. Ready/busy control circuits 760 may be implemented on a dedicated die or with other circuits as part of an interface. This arrangement may be used where multiple memory die are packaged in a single package. A die having ready/busy control circuits may be included in the package so that only one ready/busy pin is needed for the package. Typically, the controller is on a separate die.

FIG. 8 shows the busy control register 522. The busy control register is shown as having eight data bits. However, in this example, bits 2-5 are not used but are reserved for additional functions. Bits 0-1 indicate which of four inputs to the busy control circuit is provided to the controller. These inputs include array busy, cache busy, internal busy (the output of MUX 1) and other busy. While "other busy" is shown as a single line, there may be additional busy signals and additional lines. For this reason, bits 2-5 are reserved so that selection may be made from a larger number of inputs. Bit 6 is a disable bit. When bit 6 is set to 1, the output of the busy control circuit remains in the "ready" state regardless of the inputs to the busy control circuit. Bit 7 is the autoselect bit. When bit 7 is set to 1, the output of the busy control circuit depends on whether its memory unit is selected by the controller. The controller may select a memory unit by turning on the chip enable (CE) signal corresponding to that chip. However, where multiple memory units are packaged together, they may share a CE line. Therefore, any selection by CE line may not sufficiently identify an individual memory unit. A memory unit may be identified by an address provided by the controller in a command. When the controller sends a command, it may include an address that is unique to an individual memory unit. The address provided in the last command received may be considered to be the address of the selected memory unit. Thus, two techniques are described for the controller to select a memory unit. A memory system may use either of these techniques or a combination of the two to identify a memory unit. For example, a memory unit may only be selected if both the CE line is selected and the last command identified the memory unit's address. The significance of different bits in the busy control register may vary in different embodiments. For example, bits 2-5 might be eliminated in busy control register of FIG. 8. In some embodiments, autoselect may be permanently enabled so that a bit to enable/disable this feature may not be necessary.

FIG. 9 shows a truth table for the contents of the busy control register 522 shown in FIG. 8. The output 524 of the busy control circuit is in the right hand column under "BUSY." Line 1 shows DISABLE=1. In this condition the output remains 0 or low regardless of the other contents of the busy control register. This low output means that the voltage on the ready/busy pin 502 and the connected ready/busy line remains high (ready) because the output goes to the gate of an open drain transistor 528 that is connected to the ready/busy line. Lines 2-5 show the output for different values of the "select" bits. The four outputs include internal busy 412 that is the output of MUX 1 of FIG. 5. Cache busy 408 and array busy 406 represent conditions of the cache and array respectively and may be individually selected. Other busy 526 may be any busy signal that might be used by the controller. In addition, bits 2-5 may be used to select additional busy signals if needed. These are not shown in the truth table of FIG. 9. Line 6 shows autoselect=1 (autoselect enabled) and DieSelected=0 (die not selected). The output in this condition is 0 because when autoselect is enabled, the output is masked unless the controller selects the die. Here the die is not selected and so the output remains masked, i.e. it remains at 0, and therefore the ready/busy line is not affected. Lines 7-10 show the output when autoselect=1 (autoselect enabled) and DieSelect=1 (the die is selected). The output in this case depends on the selection bits. Whatever signal is selected is provided as an output in this case because the output is not masked. As can be seen, the busy control register 522 provides a flexible way to configure the ready/busy output of a memory unit. The contents of the busy control register 522 may be modified so that the meaning of the ready/busy signal is configured to a desired meaning. A busy signal may be masked. In the case of multiple memory units connected to a single controller, masking may allow the controller to monitor a single memory unit because other signals are masked. These different options may be selected by the controller by modifying the contents of the busy control register.

The contents of the busy control register 522 may be directly written by the controller using a command that specifies the address of the memory unit and the contents to be written. FIG. 10 shows a timing diagram for such a command being received by a memory unit that has multiple lines that connect the memory unit and the controller. The signal on the chip enable (CE) line is lowered to enable operation of the memory unit. The command latch enable line (CLE) is raised to allow latching of a command from the I/O port into a command register. With the CLE line high, the write enable (WE) is lowered to allow acquisition of data from I/O lines 0-7 so that a command (C) may be transferred to the command register. Command C represents the command code for Busy Control Write and indicates that the contents of the busy control register are being written. The WE line is raised at the end of the command. Next, the address latch enable (ALE) signal is raised to allow latching of address information into an address register. Again, the WE signal is lowered to allow transfer of the address data over I/O lines 0-7. The address data includes an address (A) of a specific memory unit. In this case, the memory unit addressed is whatever memory unit has a busy control register that the controller is updating. The WE signal is lowered a third time to allow selected register contents (S) to be transferred from I/O 0-7 to the busy control register of the addressed memory unit. Selected register contents S include data bits that are to be loaded into the busy control register 522 in order to configure the ready/busy signal from the memory unit. The ready/busy output of the memory unit is also shown indicating a transition in the ready/busy signal when the contents of the ready/busy control register 522 are modified. This may result because the signal changes from representing a first condition (e.g. array busy) to a second condition (e.g. cache ready). This change in the ready/busy signal may simply reflect that the meaning of the signal has changed, not that any condition in the memory unit has changed.

In some examples, it may be desirable to change the contents of the ready/busy control registers of all memory units that are connected to a controller. In such cases, there is no need to address a busy control write command to a particular unit. FIG. 11 shows an example of a busy control write command that does not specify a memory unit address. The timing diagram is similar to that shown in FIG. 10 but without an address being sent by the controller. Such an unaddressed command may be sent where only one memory unit is connected to a controller or where the CE line is sufficient to identify an individual memory unit (e.g. CE line is not shared). An unaddressed command may also be used where multiple memory units are connected to a controller and it is desired to configure the contents of the busy control registers of all of the memory units at the same time to have the same contents. Such a command is broadcast to all connected memory units that have CE on, at the same time, so that all memory units receive the same register contents. For example, the autoselect function previously described is typically enabled for all memory units in parallel. Such broadcast commands may save time compared with separately writing the contents of each busy control register with a separate command.

A command to rewrite the contents of the busy control register may be sent at any time that the memory unit is capable of receiving a command. Thus, in some embodiments the ready/busy signal may be switched from array busy to cache busy while the memory unit is carrying out an operation. Depending on the memory design, it may be possible to configure the busy control register while data is being programmed to the memory array.

FIGS. 12A-12G shows an example of how aspects of the present invention may be used in a buffered non-volatile memory array with a cache such as that shown in FIG. 3. FIG. 12 shows successive steps of a data storage operation in a buffered memory array with a cache.

FIG. 12A shows a memory array 1270, a buffer 1272, a cache 1274 and a controller 1276. Both the cache 1247 and the memory array 1270 are ready in this figure as indicated by the "R" next to the memory array and the "R" next to the cache 1274. The buffer 1272 and cache 1274 are two registers, with each register holding a page of data for programming to the memory array.

In FIG. 12B data is transferred from the controller 1276 to the cache 1274. This may occur in response to a command from the controller such as a write command that specifies the location in the memory array at which to store the data. Typically, in systems where a ready/busy signal is tied to the last command received from the controller, a write command in this situation would cause the cache busy signal to be supplied to the controller. This is so that the controller may send more data to the cache as soon as the cache is available. FIG. 12B shows data being transferred from the controller 1276 to the cache 1274. The time required for such an operation depends on the amount of data being stored in the cache 1274. This is generally one page of data. For a page that holds single sector of data, about 10 microseconds may be needed. Where the memory unit programs multiple sectors in parallel, such as in designs using metablocks, the cache 1274 may be much larger than one sector. For example, where a metablock comprises sixteen blocks, a metapage may comprise sixteen sectors of data. Therefore, the cache 1274 also holds sixteen sectors of data. The time necessary to transfer sixteen sectors of data is approximately 160 microseconds. During this operation, the cache 1274 is ready as indicated by the "R" next to the cache 1274, enabling the controller 1276 to continue to send data. The letters "R" and "B" are used throughout FIG. 12 to indicate the condition of the adjacent part as either ready (R) or busy (B). The memory array 1270 remains in the ready condition at this time because no data is being written to the array. When the transfer of data to the cache 1274 is completed, the cache 1274 is in a busy condition because it contains data and may not accept additional data from the controller 1276.

FIG. 12C shows the transfer of data from the cache 1276 to the buffer 1272. This is a relatively rapid operation and may be done in under 3 microseconds. During this step, the cache 1274 remains busy while the memory array 1270 remains ready.

FIG. 12D shows data that was transferred to the buffer 1272 being committed to the memory array 1270. The memory array 1270 is busy in this step because it is being written to. However, the cache 1274 becomes ready once the data that was in the cache 1274 has completed transferring to the buffer 1272. This ready condition may be signaled to the controller 1276 so that more data can be sent to the cache 1274. The cache ready/busy signal is important to the controller at this point so that transfer of data may begin as soon as possible.

FIG. 12E follows immediately from the previous step and shows data being sent to the cache 1274 in parallel with programming of data to the memory array 1270. This parallel operation may allow increased data transfer speed from the controller 1276 to the memory array 1270. Programming data to the memory array 1270 is a relatively slow operation taking approximately 150 microseconds to 1000 microseconds so that performing other operations in this time may be important to overall operating speed. During this step the memory array is busy but the cache 1274 is ready. Where a high degree of parallelism is used for programming (e.g. in where metablocks are used), programming to the memory array 1270 may be faster than the transfer of data to the cache 1274. However, generally the transfer to the cache 1274 will finish first.

FIG. 12F shows the situation after all the data has been transferred from the controller 1276 to fill the cache 1274. The cache 1274 contains data and is therefore in a busy condition. Programming of data to the memory array 1270 is shown as continuing in this figure. In this example, programming to the memory array 1270 continues after data transfer to the cache 1274 is finished. However, in other examples these two operations may finish at the same time or programming the memory array 1270 may finish first.

FIG. 12G show the situation after the completion of writing of data to the memory array 1270 and to the cache 1274. The memory array 1270 is ready at this point because it is no longer busy programming data. The cache 1274 is busy because it is not able to accept new data from the controller 1276 due to the data already stored there.

FIG. 12H shows the transfer of data from the cache 1274 to the buffer 1272 as in FIG. 12C. At this point, more data may be supplied by the controller 1276 so that the cycle returns to the step shown in FIG. 12D. The steps shown in FIGS. 12D-12G may be repeated multiple times for as long as the controller supplies data.

FIG. 12I shows the situation after completion of the transfer of data from the cache 1274 to the buffer 1272 in FIG. 12H. Here, the memory array 1270 is busy because of the write operation in progress. The cache 1274 is ready because it is able to accept more data. However, in this case the controller 1276 does not have any more data to store in the memory array 1270. Therefore, the cache 1274 continues to remain in the ready state while the memory array 1270 remains in the busy state for as long as the data is being written.

Typically, the signal sent to the controller 1270 over the ready/busy line indicates either memory array condition or cache condition. For a write sequence such as that described with respect to FIGS. 12A to 12H, the ready/busy line generally sends a signal that indicates whether the cache 1274 is ready to accept more data. This signal is selected so that as soon as a ready signal is received by the controller, more data may be sent. Information about the condition of the cache 1274 is generally more important to the controller during a write sequence than information about the condition of the memory array 1270. However, at the point shown by FIG. 12H, it may be desirable to know the condition of the memory array 1270 rather than that of the cache 1274. This is because there is no more data to send to the cache 1274 and so the condition of the cache 1274 is not required. Until the memory array 1270 becomes ready, the controller 1276 may not be able to begin another operation such as a write operation. This is because there is unprogrammed data still in the buffer 1272 until the memory array is ready.

In some memory systems a status register is provided that indicates conditions of parts of the memory system. FIG. 12I shows a status register 1278 that indicates whether the memory array 1270 is ready or busy and indicates whether the cache 1274 is ready or busy. The status register is typically part of a memory unit. It may be polled by a controller where the controller actively reads the contents. However, this method of informing the controller of the conditions in the memory unit is not ideal. Polling may require significant power. Also, in controllers that have a low-power mode, it may be necessary to keep the controller fully powered in order to perform a polling operation. For the situation shown in FIG. 12I, the controller 1276 may need to repeatedly poll the status register 1278 until the memory array 1270 changes from a busy condition to a ready condition.

In an embodiment of the present invention, the controller 1270 may select which signal is sent from a memory unit on the ready/busy line. For the situation shown in FIG. 12A-I this may have certain advantages. For the process steps shown in FIGS. 12A to 12E, it may be advantageous for the controller 1276 to receive a signal indicating which condition the cache 1274 is in. This allows the controller to send data to the memory unit rapidly because as soon as the cache 1274 is ready, more data is sent. However, in the condition shown in FIG. 12I, where the controller 1276 has no more data to send to the memory unit, the controller 1276 does not need to know the condition of the cache 1274. At this point, the condition of the memory array 1270 may be selected as the output that is sent on the ready/busy line. This selection may be done by the controller 1276 by changing the contents of the busy control register 522.

In some designs, a controller may have a low power or "sleep" mode in which power consumption by the controller is reduced. The more time the controller spends in such a low-power mode the less power is consumed. Therefore, a controller may be put in low-power mode whenever possible including between operations or while some operation is being carried out by a memory unit that does not require immediate controller involvement. In some examples, a controller may be returned to full-power mode in response to a change in a signal line such as a ready/busy signal. Thus, the controller may be "woken up" when it is time for the controller to perform a subsequent operation. For example, in FIG. 12I, the controller could send a command that changes the contents of the busy control register so that the array busy signal is sent to the controller on the ready/busy line. The controller might then enter a sleep mode until a ready signal is received on the ready/busy line. This may save significant power compared with repeatedly polling the status register and may also be easier to implement in the controller. Such power savings are particularly important for memory systems that are used in portable units such as digital cameras and MP3 players that depend on battery power and therefore have a limited supply of power.

The example above refers to buffered non-volatile memory with cache such as those found in removable memory cards. However, aspects of this invention may be applied to other integrated circuits in other applications also. Other memory devices, including volatile memory products may use similar techniques to achieve greater functionality from a single line. Non-memory applications may use the techniques described also.

While the above is a full description of the specific embodiments, various modifications, alternative constructions and equivalents may be used. Therefore, the above description and illustrations should not be taken as limiting the scope of the present invention which is defined by the claims.

The invention claimed is:

1. A memory unit in communication with a memory controller over a signal line in a memory system, comprising:
   a buffered array of non-volatile memory cells that includes a cache connected to the array of non-volatile memory cells; and
   a control circuit that selects an output signal from the memory unit from a plurality of signals according to data bits in a control register, the plurality of signals including a first signal indicating whether the buffered array is in a cache ready condition or a cache busy condition and a second signal indicating whether the buffered array is in an array ready condition or an array busy condition.

2. The memory unit of claim 1 wherein the buffered array of non-volatile memory cells is on a first semiconductor die and the controller is on a second semiconductor die.

3. The memory unit of claim 1 wherein the plurality of signals further includes a third signal that indicates that the memory unit is not busy, the third signal being selected by the control circuit in response to a data bit or bits in the control register whenever the memory unit is not selected by the controller.

4. A memory system having a buffered non-volatile memory array in communication with a controller, comprising:
   a controller;
   an array of non-volatile memory cells;
   a cache connected to the array of non-volatile memory cells to hold data to be programmed to the array of non-volatile memory cells; and
   a ready/busy control circuit containing a control register, the ready/busy control circuit selecting an output signal to the controller from a plurality of signals including a first signal that indicates a ready/busy status of the array of non-volatile memory cells and a second signal that indicates a ready/busy status of the cache, the output signal selected according to the contents of the control register.

5. The memory system of claim 4 further comprising one or more additional buffered non-volatile memory arrays in communication with the controller via the signal line, an additional buffered non-volatile memory array having an additional control register that selects an additional signal.

6. The memory unit of claim 1 wherein the control circuit includes a first multiplexer that accepts the first signal and second signal as inputs and selects one of the input signals as a first multiplexer output, the control circuit further including a second multiplexer that accepts the first multiplexer output and one or more additional signals as second multiplexer inputs and selects one of the second multiplexer inputs as the output signal of the control circuit.

7. The memory unit of claim 1 further comprising one or more additional memory units in communication with the controller through the signal line, an individual additional memory unit having an output that combines a cache ready/busy signal and an array ready/busy signal for the additional memory unit.

8. The memory system of claim 4 herein the output signal is selected according to one or more bits in the control register that are written by the controller.

9. The memory system of claim 4 wherein the output signal is selected according to a chip enable signal that is sent by the controller.

10. The memory system of claim 4 wherein the output signal is selected by the control register according to an address in a most recent command sent by the controller.

11. A memory system having a plurality of memory units in communication with a controller over a signal line, comprising:
  a controller;
  a plurality of memory units, an individual one of the plurality of memory units comprising a buffered array of non-volatile memory cells and a cache, a plurality of signals indicating conditions of the memory unit including at least array ready/busy and cache ready/busy, and a control register that selects an output signal to the controller from the plurality of signals.

12. The memory system of claim 11 wherein the control register includes a first designated bit, the control register disabling the output signal from the individual memory unit to the controller if the first designated bit in the control register is set by the controller.

13. The memory system of claim 12 wherein the control register includes a second designated bit that can be set by the controller, the second designated bit, when set, causing the control register to disable the output signal from the individual memory unit if the memory unit is not selected by the controller, and to select an output signal according to additional bits in the control register if the memory unit is selected by the controller.

14. The memory system of claim 13, wherein the additional bits in the control register are used to select between array ready/busy, cache ready/busy and at least one additional signal.

15. The memory system of claim 13 wherein the additional bits are set by a command from the controller that specifies the additional bits.

16. The memory system of claim 1 wherein the plurality of signals consists of the first signal and the second signal.

17. The memory system of claim 16 wherein the control circuit selects the output signal to be either the first signal or the second signal.

* * * * *

UNITED STATES PATENT AND TRADEMARK OFFICE
CERTIFICATE OF CORRECTION

PATENT NO.        : 8,429,313 B2
APPLICATION NO.   : 10/857532
DATED             : April 23, 2013
INVENTOR(S)       : Peter Smith and Sergey Gorobets It is certified that error appears in the above-identified patent and that said Letters Patent is hereby corrected as shown below:

In the Claims:

In column 15, Line 11, change "herein" to --wherein--.

Signed and Sealed this
Eleventh Day of June, 2013

Teresa Stanek Rea
*Acting Director of the United States Patent and Trademark Office*